(12) United States Patent
Fukasawa et al.

(10) Patent No.: US 11,489,493 B2
(45) Date of Patent: Nov. 1, 2022

(54) CURRENT CONTROL CIRCUIT AND POWER AMPLIFIER CIRCUIT

(71) Applicant: Murata Manufacturing Co., Ltd., Kyoto (JP)

(72) Inventors: Mikiko Fukasawa, Kyoto (JP); Kazuhiko Ishimoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/781,058

(22) Filed: Feb. 4, 2020

(65) Prior Publication Data

US 2020/0252029 A1 Aug. 6, 2020

(30) Foreign Application Priority Data

Feb. 5, 2019 (JP) ............................. JP2019-019170

(51) Int. Cl.
| | | |
|---|---|---|
| H03F 1/02 | (2006.01) | |
| H03F 3/19 | (2006.01) | |
| H03F 1/52 | (2006.01) | |
| H03F 3/21 | (2006.01) | |

(52) U.S. Cl.
CPC ............ *H03F 1/0216* (2013.01); *H03F 1/52* (2013.01); *H03F 3/19* (2013.01); *H03F 3/21* (2013.01); *H03F 2200/451* (2013.01)

(58) Field of Classification Search
CPC ............ H03F 1/0216; H03F 1/52; H03F 3/19; H03F 3/21; H03F 2200/451

USPC .......................................................... 330/253
See application file for complete search history.

(56) References Cited

U.S. PATENT DOCUMENTS

| | | | | |
|---|---|---|---|---|
| 7,439,810 | B2 * | 10/2008 | Manicone | ............. H03F 1/0261 |
| | | | | 330/296 |
| 7,683,712 | B2 | 3/2010 | Suzaki | |
| 10,263,571 | B2 * | 4/2019 | Han | ...................... H03F 1/0205 |
| 2004/0201421 | A1 * | 10/2004 | Winslow | ................ H04B 1/006 |
| | | | | 330/290 |
| 2007/0222520 | A1 * | 9/2007 | Inamori | ..................... H03F 1/30 |
| | | | | 330/289 |
| 2008/0231368 | A1 | 9/2008 | Suzaki | |
| 2018/0331661 | A1 * | 11/2018 | Lam | ...................... H03F 1/0266 |

FOREIGN PATENT DOCUMENTS

| | | |
|---|---|---|
| JP | 2007-258949 A | 10/2007 |
| JP | 2008-271517 A | 11/2008 |

\* cited by examiner

*Primary Examiner* — Hafizur Rahman
(74) *Attorney, Agent, or Firm* — Pearne & Gordon LLP

(57) ABSTRACT

A current control circuit controls a base current of a first transistor included in a bias circuit outputting a bias current to a power amplifier based on a base-collector voltage of the first transistor. The current control circuit includes a first circuit that outputs a signal associated with the base-collector voltage of the first transistor, and a second circuit that, based on the signal, provides electrical continuity between a base of the first transistor and a reference potential.

10 Claims, 7 Drawing Sheets

CURRENT CONTROL CIRCUIT AND POWER AMPLIFIER CIRCUIT

This application claims priority from Japanese Patent Application No. 2019-019170 filed on Feb. 5, 2019. The content of this application is incorporated herein by reference in its entirety.

BACKGROUND

The present disclosure relates to current control circuits and power amplifier circuits. A technique for protecting a power amplifier by suppressing an operating current (collector current) of the power amplifier is known in the art.

In a high frequency power amplifier described in Japanese Unexamined Patent Application Publication No. 2008-271517 (Patent Document 1), a first detector circuit and a second detector circuit are connected to an input terminal and an output terminal of the last stage, respectively. Detection signals detected at the respective detector circuits are input to a differential amplifier. A comparator compares an output signal of the differential amplifier with a reference voltage. A base bias circuit outputs a bias current to the last stage based on an output signal of the comparator. This enables the high frequency power amplifier of the Patent Document 1 to prevent damaging the last stage by suppressing an operating current of the last stage based on a change in a load impedance.

BRIEF SUMMARY

The high frequency power amplifier of the Patent Document 1 monitors voltage amplitudes of input and output and suppresses damage to the voltage amplitudes. Accordingly, because the high frequency power amplifier of the Patent Document 1 only monitors the voltage amplitudes of input and output and does not monitor currents thereof, the high frequency power amplifier of the Patent Document 1 is less accurate in terms of current.

The present disclosure is able to control an operating current of an power amplifier with a high degree of precision.

A current control circuit according to one aspect of the present disclosure controls a base current of a first transistor based on a base-collector voltage of the first transistor, the first transistor being included in a bias circuit outputting a bias current to a power amplifier.

A power amplifier circuit according to one aspect of the present disclosure includes a power amplifier that amplifies a high frequency signal, a bias circuit including a first transistor that outputs a bias current to the power amplifier, and a current control circuit that controls a base current of the first transistor based on a base-collector voltage of the first transistor.

Other features, elements, characteristics and advantages of the present disclosure will become more apparent from the following detailed description of embodiments of the present disclosure with reference to the attached drawings.

DETAILED DESCRIPTION

Hereinafter, embodiments of current control circuits and power amplifier circuits of the present disclosure are described in detail with reference to the drawings. Note that the present disclosure is not limited by these embodiments. Needless to say, each embodiment is for illustrative purposes only, and constituting elements illustrated in different embodiments may be combined or partially exchanged. In the description of the second embodiment and subsequent embodiments, descriptions regarding matters common to the first embodiment will be omitted, and only points different from the first embodiment will be described. In particular, similar actions and effects produced by similar constituting elements will not be repeated in every embodiment.

First Embodiment

The first embodiment will be described below. However, to facilitate understanding of the first embodiment, a comparison example is described first.

Comparison Example

Figure 1:
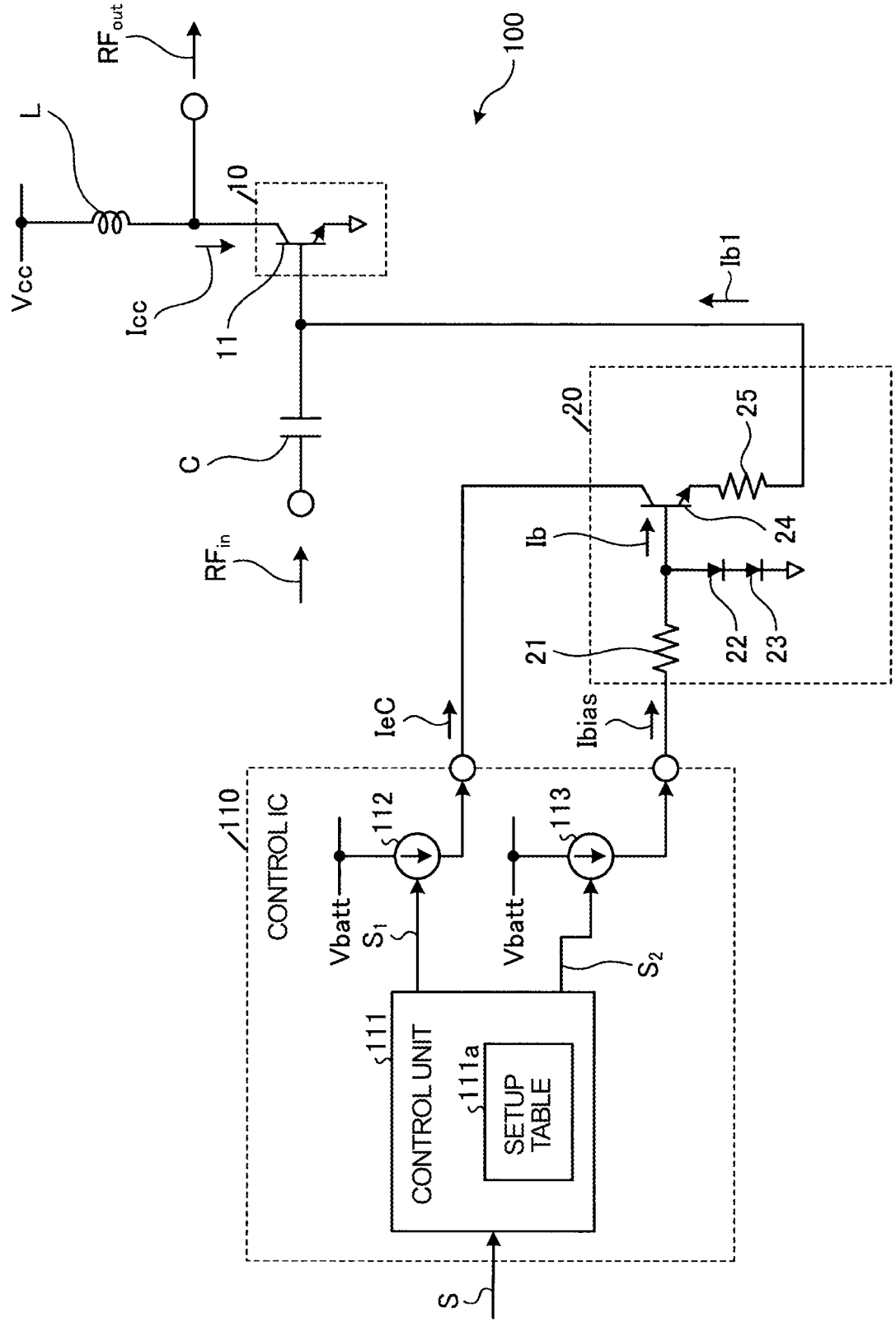
FIG. 1 is a diagram illustrating a configuration of a power amplifier circuit of a comparison example.

FIG. 1 is a diagram illustrating a configuration of a power amplifier circuit of a comparison example. A power amplifier circuit 100 includes a power amplifier 10, a bias circuit 20, and a control integrated circuit (IC) 110.

The power amplifier 10 includes a transistor 11. In the present disclosure, the transistor is exemplified as a heterojunction bipolar transistor (HBT) but is not limited thereto. For example, the transistor may alternatively be a field effect transistor (FET). The transistor may also be a multi-finger transistor in which a plurality of unit transistors (also referred to as fingers) are electrically connected in parallel to each other. The unit transistor means a minimum configuration that constitutes a transistor.

An emitter of the transistor 11 is electrically connected to a reference potential. The reference potential is exemplified as a ground potential but is not limited thereto in the present disclosure. A base of the transistor 11 is electrically connected to one end portion of a capacitor C. The other end portion of the capacitor C receives a high frequency input signal RFin. The capacitor C is a DC-cut capacitor that allows only an alternating-current signal to pass and blocks a direct-current signal.

The base of the transistor 11 receives a bias current Ib1 from the bias circuit 20. A collector of the transistor 11 is electrically connected to a power supply potential Vcc via a choke inductor L. A collector current Icc, which serves as an operating current, flows through the collector of the transistor 11.

The choke inductor L has the function of blocking alternating-current power. Here, it is assumed that the choke inductor L has a sufficiently high impedance in the frequency bands of the high frequency input signal RFin and a high frequency output signal RFout. That is to say, it is assumed that the impedance of the choke inductor L can be ignored when considering the frequency bands of the high frequency input signal RFin and the high frequency output signal RFout. Further, the choke inductor L suppresses leaking of the high frequency input signal RFin and the high frequency output signal RFout to a power supply circuit.

The transistor 11 outputs the high frequency output signal RFout that has been amplified from the collector.

The bias circuit 20 includes resistors 21 and 25, diodes 22 and 23, and a transistor 24.

One end portion of the resistor 21 receives a bias current Ibias from the control IC 110. Alternatively, the one end portion of the resistor 21 may receive supply of a constant voltage in place of the bias current Ibias.

The other end portion of the resistor 21 is electrically connected to an anode of the diode 22. In the present disclosure, the diode may alternatively be a transistor whose collector and base are electrically connected to each other (diode connected transistor).

A cathode of the diode 22 is electrically connected to an anode of the diode 23. A cathode of the diode 23 is electrically connected to the reference potential.

The potential of the anode of the diode 22 corresponds to the amount of the voltage drop of the diodes 22 and 23. That is to say, the potential of the anode of the diode 22 corresponds to the voltage drop of two diodes.

A base of the transistor 24 is electrically connected to the other end portion of the resistor 21 and the anode of the diode 22. A base of the transistor 24 receives supply of a base current Ib via the resistor 21. A current value of the base current Ib is a value obtained by subtracting a current value of a current flowing through the diodes 22 and 23 from a current value of the bias current Ibias. A base potential of the transistor 24 is substantially equal (the deviation of the base potential of the transistor 24 can be less than 2% from the potential of the anode of the diode 22) to the potential of the anode of the diode 22.

A collector of the transistor 24 receives a collector current IeC from the control IC 110.

An emitter of the transistor 24 is electrically connected to the base of the transistor 11 via the resistor 25. Accordingly, the transistor 24 operates as an emitter follower circuit of emitter output. Accordingly, the potential of the base of the transistor 11 is kept constant. The transistor 24 outputs the bias current Ib1 from the emitter thereof to the base of the transistor 11.

The control IC 110 includes a control unit 111 and constant current sources 112 and 113. The control unit 111 includes a setup table 111a. The setup table 111a sets setup values of the collector current IeC and the bias current Ibias for suppressing the current value of the collector current Icc of the transistor 11 so as not to exceed a desired current value.

The control unit 111 reads out the setup values from the setup table 111a based on a control signal S to be input. Further, based on the setup values, the control unit 111 outputs a control signal $S_1$ to the constant current source 112 and outputs a control signal $S_2$ to the constant current source 113.

The constant current source 112 is electrically connected between a power supply potential Vbatt and the collector of the transistor 24. Further, the constant current source 112 outputs the collector current IeC associated with the control signal $S_1$ to the collector of the transistor 24.

The constant current source 113 is electrically connected between the power supply potential Vbatt and the one end portion of the resistor 21. Further, the constant current source 113 outputs the bias current Ibias associated with the control signal $S_2$ to the one end portion of the resistor 21.

Assuming the current amplification factor of the transistor 11 is $\beta$ ($=h_{FE}$), the collector current Icc of the transistor 11 is expressed by the following formula (1):

$$Icc = \beta \times Ib1 \qquad (1)$$
$$= \beta(IeC + Ib)$$

The control IC 110 can suppress the current value of the collector current Icc of the transistor 11 so as not to exceed a desired current value by outputting the collector current IeC and the bias current Ibias ($\approx$Ib) associated with the control signal S. This enables to suppress overcurrent in the transistor 11 and the power supply and suppress damage to the transistor 11 and the power supply.

Figure 2:
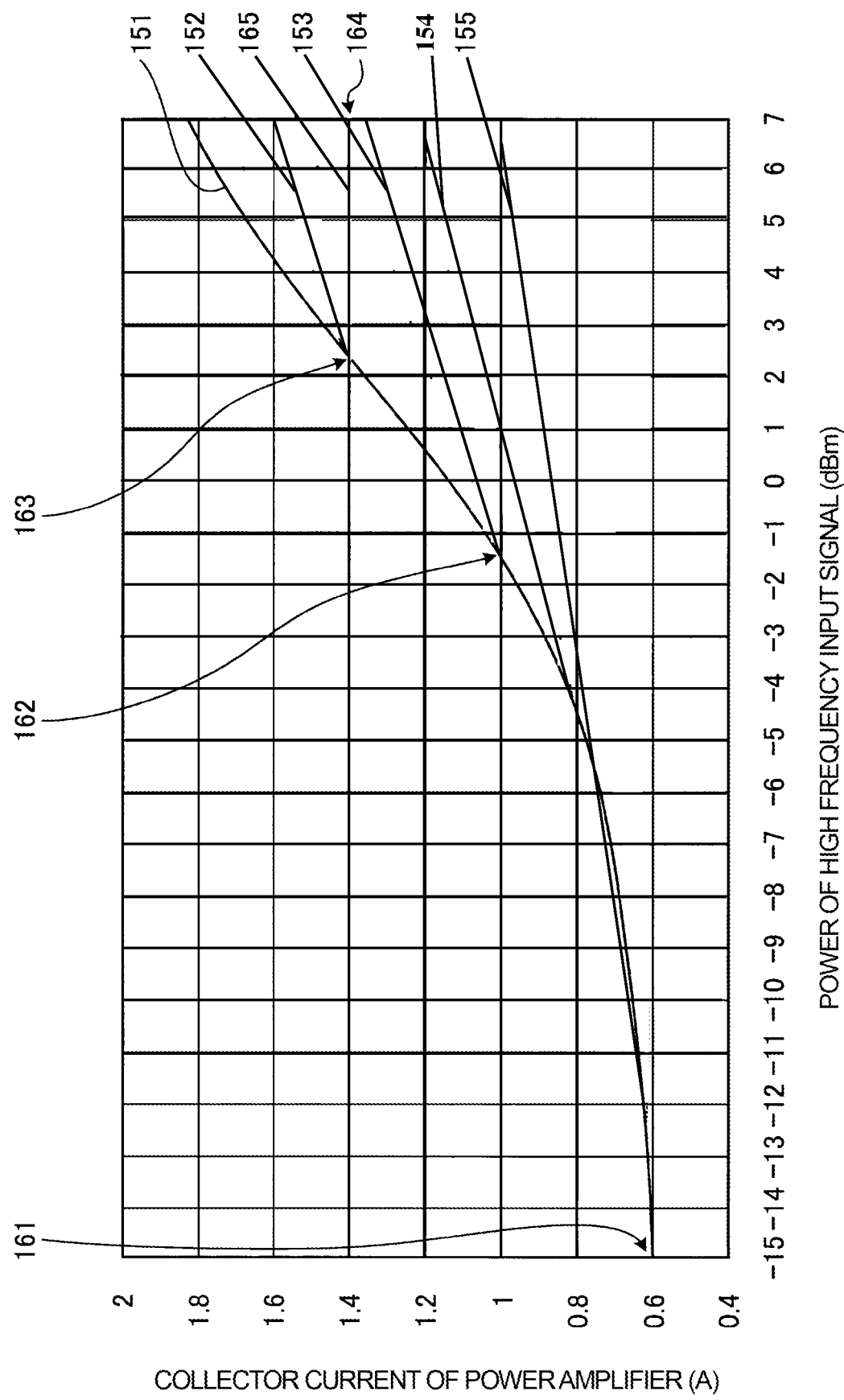
FIG. 2 is a diagram illustrating a circuit simulation result of the power amplifier circuit of the comparison example.

FIG. 2 is a diagram illustrating a circuit simulation result of the power amplifier circuit of the comparison example. Specifically, FIG. 2 is a diagram illustrating a relationship between the high frequency input signal RFin (dBm) and the collector current Icc (ampere (A)) of the transistor 11.

A line 151 is the line illustrating a relationship between the high frequency input signal RFin and the collector current Icc of the transistor 11 in the case where the collector current Icc is not suppressed in any way. A line 152 is the line illustrating a relationship between the high frequency input signal RFin and the collector current Icc of the transistor 11 in the case where the collector current Icc is suppressed so as not to exceed about 1.6 amperes.

A line 153 is the line illustrating a relationship between the high frequency input signal RFin and the collector current Icc of the transistor 11 in the case where the collector current Icc is suppressed so as not to exceed about 1.4 amperes. A line 154 is the line illustrating a relationship between the high frequency input signal RFin and the collector current Icc of the transistor 11 in the case where the collector current Icc is suppressed so as not to exceed about 1.2 amperes. A line 155 is the line illustrating a relationship between the high frequency input signal RFin and the collector current Icc of the transistor 11 in the case where the collector current Icc is suppressed so as not to exceed about 1.0 ampere.

Hereinafter, the description is provided by taking the case where the collector current Icc is suppressed so as not to exceed about 1.4 amperes (the case of the line 153) as an example.

In the case where the collector current Icc is suppressed so as not to exceed about 1.4 amperes, ideally, the collector current Icc can follow the following trajectory. Therefore, the collector current Icc can follow the line 151 from a point 161 (RFin≈−15 dBm, Icc≈0.6 amperes) to a point 163 where the line 151 crosses a line 165 representing about 1.4 amperes and follows the line 165 (about 1.4 amperes) after the point 163.

However, in practice, although the collector current Icc follows the line 151 from the point 161 to a point 162 (RFin≈−1.3 dBm, Icc≈1.02 amperes), the collector current Icc gradually increases after the point 162 to a point 164. The reason is as follows.

A collector potential of the transistor 24 decreases when the bias current Ib1 increases and approaches the collector current IeC. When Ib1≈IeC, the collector potential of the transistor 24 is substantially equal (the deviation of the collector potential of the transistor 24 can be less than 2% from the base potential of the transistor 24) to the base potential of the transistor 24. As the bias current Ib1 further increases, the collector potential of the transistor 24 becomes lower than the base potential of the transistor 24. Then, a forward-direction voltage is applied to a p-n junction between the base and the collector of the transistor 24. Accordingly, part of the base current Ib of the transistor 24 flows from the base to the emitter, and at the same time another part of the base current Ib of the transistor 24 flows from the base to the emitter via the collector.

That is to say, in FIG. 2, the increase in the collector current Icc of the transistor 11 from the point 162 to the point 164 on the line 153 is caused not by the collector current IeC of the transistor 24 but by the base current Ib of the transistor 24.

In the present disclosure, the difference between the ideal trajectory (point 162→point 163→point 164) and the actual trajectory (point 162→point 164 on the line 153) of the collector current Icc of the transistor 11 is referred to as a "variation".

Principles behind how the base current Ib of the transistor 24 caused the above are as follows.

(1) As the power of the high frequency input signal RFin increases, the collector current Icc of the transistor 11 increases, and then the bias current Ib1 of the transistor 11 increases.

(2) Because the current value of the collector current IeC of the transistor 24 is a fixed value, the collector potential of the transistor 24 decreases. When the collector potential of the transistor 24 decreases, the current amplification factor β of the transistor 24 decreases.

(3) Because of the decrease in the current amplification factor β, a restriction of the bias current Ib1 of the transistor 11 is initiated at the point 162. However, in the part corresponding to the "variation", the bias current Ib1 of the transistor 11 is not restricted quickly.

(4) Of the bias current Ibias, a proportion of the base current Ib of the transistor 24 increases. In other words, of the bias current Ibias, a proportion of the current flowing to the diodes 22 and 23 decreases. That is to say, the current flowing into the diodes 22 and 23 decreases while the base current Ib of the transistor 24 increases. A large proportion of the bias current Ibias flows to the diodes 22 and 23. However, when the bias current Ib1 of the transistor 11 is restricted, the current flowing into the diodes 22 and 23 decreases while the base current Ib of the transistor 24 increases.

(5) When the current flowing into the diodes 22 and 23 decreases, the voltages at the diodes 22 and 23 decrease. Then, the transistor 24 operates only using the bias current Ibias, and the bias current Ib1 of the transistor 11 is gradually restricted.

In consideration of the above, in the case where the collector current Icc of the transistor 11 is suppressed in such a way that the final upper limit of the collector current Icc of the transistor 11 becomes equal to about 1.4 amperes, the setup value of the collector current IeC of the transistor 24 needs to be reduced to much less than about 1.4 amperes (for example, nearly 1.02 amperes of the point 162).

In this way, in the power amplifier circuit 100, the control of the collector current Icc of the transistor 11 depends much more on the control of the base current Ib of the transistor 24 than on the control of the collector current IeC of the transistor 24. This is because, according to the formula (1), in order to control the collector current Icc of the transistor 11 with a high degree of precision, the collector current IeC of the transistor 24 and the base current Ib of the transistor 24 need to be controlled. All of the collector current IeC of the transistor 24 flows to the emitter of the transistor 24. Accordingly, it is easy to control the collector current IeC of the transistor 24. Whereas, a large portion of the bias current Ibias flows to the diodes 22 and 23, and part of the bias current Ibias flows to the emitter of the transistor 24 via the base of the transistor 24. Accordingly, the base current Ib of the transistor 24, which is part of the bias current Ibias, is not easy to control. This increase the "variation" in the power amplifier circuit 100. Accordingly, the power amplifier circuit 100 cannot control the collector current Icc of the transistor 11 with a high degree of precision.

First Embodiment

Figure 3:
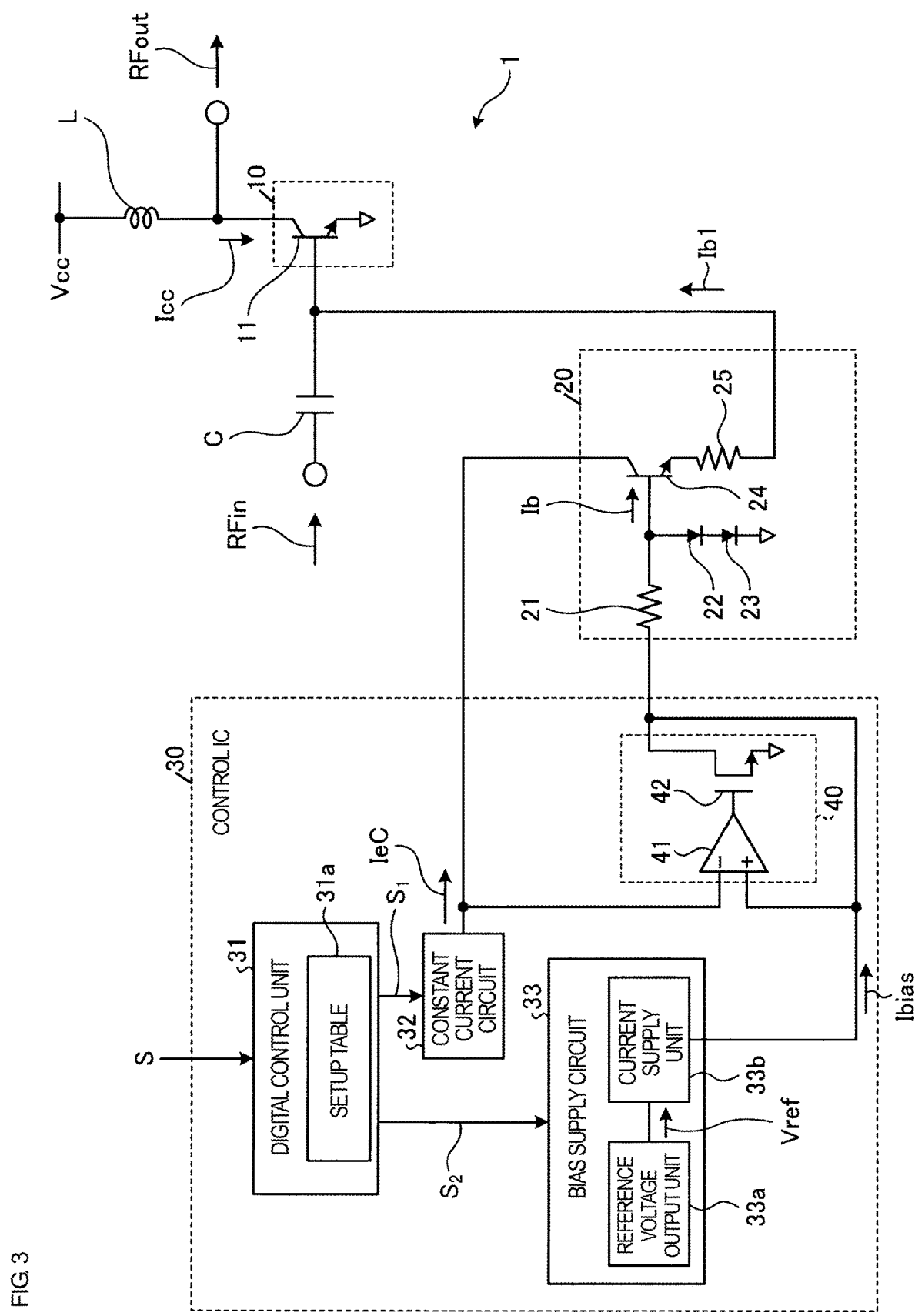
FIG. 3 is a diagram illustrating a configuration of a power amplifier circuit of a first embodiment.

FIG. 3 is a diagram illustrating a configuration of a power amplifier circuit of the first embodiment. A power amplifier circuit 1 includes a control IC 30 in place of the control IC 110, compared with the power amplifier circuit 100 (see FIG. 1) of the comparison example.

The circuit configurations of the power amplifier 10 and the bias circuit 20 are similar to those of the comparison example, and the description thereof is omitted. The transistor 24 in the bias circuit 20 corresponds to the "first transistor" of the present disclosure.

The power amplifier 10, the bias circuit 20, and the control IC 30 may form a single module or may form separate modules.

The power amplifier 10 amplifies a high frequency input signal RFin of a radio frequency input from a circuit in a previous stage. Further, the power amplifier 10 outputs a high frequency output signal RFout that has been amplified to a circuit in a subsequent stage. As an example of the previous stage, a transmission power control circuit that adjusts the power of a modulation signal is illustrated. However, the previous stage is not limited thereto in the present disclosure. As an example of the subsequent stage, a front-end circuit that transmits the high frequency output signal RFout to an antenna after performing filtering and the like is illustrated. However, the subsequent stage is not limited thereto in the present disclosure.

As an example, the case where frequencies of the high frequency input signal RFin and the high frequency output signal RFout are between several hundreds of MHz (megahertz) to several tens of GHz (gigahertz) is illustrated. However, the frequencies of the high frequency input signal RFin and the high frequency output signal RFout are not limited thereto in the present disclosure.

In the present disclosure, it is assumed that only a single stage of power amplifier is included, but the number of power amplifier stages is not limited thereto. Alternatively, there may be a plurality of power amplifier stages. In the case where a plurality of power amplifier stages is included, the last stage has the highest power. Accordingly, the power amplifier 10 can be the last stage (power stage).

The control IC 30 includes a digital control unit 31, a constant current circuit 32, a bias supply circuit 33, and a current control circuit 40.

The digital control unit 31 includes a setup table 31*a*. The setup table 31*a* sets the setup values for suppressing the current value of the collector current Icc of the transistor 11 so as not to exceed a desired current value.

The digital control unit 31 reads out setup values from the setup table 31*a* based on an input control signal S. Further, based on the setup values, the digital control unit 31 outputs a control signal $S_1$ to the constant current circuit 32 and outputs a control signal $S_2$ to the bias supply circuit 33.

The constant current circuit 32 outputs the collector current IeC associated with the control signal $S_1$ to the collector of the transistor 24.

The bias supply circuit 33 includes a reference voltage output unit 33a and a current supply unit 33b.

The reference voltage output unit 33a outputs a reference voltage Vref to the current supply unit 33b. The current supply unit 33b outputs the bias current Ibias associated with the control signal $S_2$ based on the reference voltage Vref to one end portion of the resistor 21.

The current control circuit 40 includes an operational amplifier 41 and an N-channel type transistor 42. The current control circuit 40 suppresses the base current of the transistor 24 based on a base-collector voltage of the transistor 24. Note that in the case where the N-channel type transistor 42 is replaced with a P-channel type transistor, the current control circuit 40 can be realized by inverting the connection relationship of a non-inverting input and an inverting-input of the operational amplifier 41.

The inverting input terminal of the operational amplifier 41 is electrically connected to the collector of the transistor 24. The non-inverting input terminal of the operational amplifier 41 is electrically connected to the one end portion of the resistor 21. An output terminal of the operational amplifier 41 is electrically connected to a gate of the transistor 42. That is to say, the operational amplifier 41 outputs a signal associated with the base-collector voltage of the transistor 24 to the gate of the transistor 42. That is to say, the inverting input terminal of the operational amplifier 41 is connected to the collector of the transistor 24, the non-inverting input terminal of the operational amplifier 41 is connected to the base of the transistor 24, and the inverting input terminal and the non-inverting input terminal are virtually shorted. Thus, the operational amplifier 41 is configured to monitor the potential difference between the base and the collector of the transistor 24. If there is a potential difference between the base and the collector, a voltage is supplied to the gate of the transistor 42. This turns on the transistor 24 and causes the constant current circuit 32 to be shorted. Because no current is supplied to the collector of the transistor 24, the restriction of current is achieved.

The operational amplifier 41 corresponds to the "first circuit" of the present disclosure. The first circuit is not limited to the operational amplifier but may be any differential amplifier. However, the operational amplifier has very large input impedance. Thus, the operational amplifier is suitable for detecting the base-collector voltage without necessarily affecting the base potential and the collector potential of the transistor 24. Accordingly, the first circuit can be an operational amplifier.

A source of the transistor 42 is electrically connected to a reference potential. A drain of the transistor 42 is electrically connected to one end portion of the resistor 21.

The transistor 42 corresponds to the "second circuit" and the "second transistor" of the present disclosure.

Figure 4:
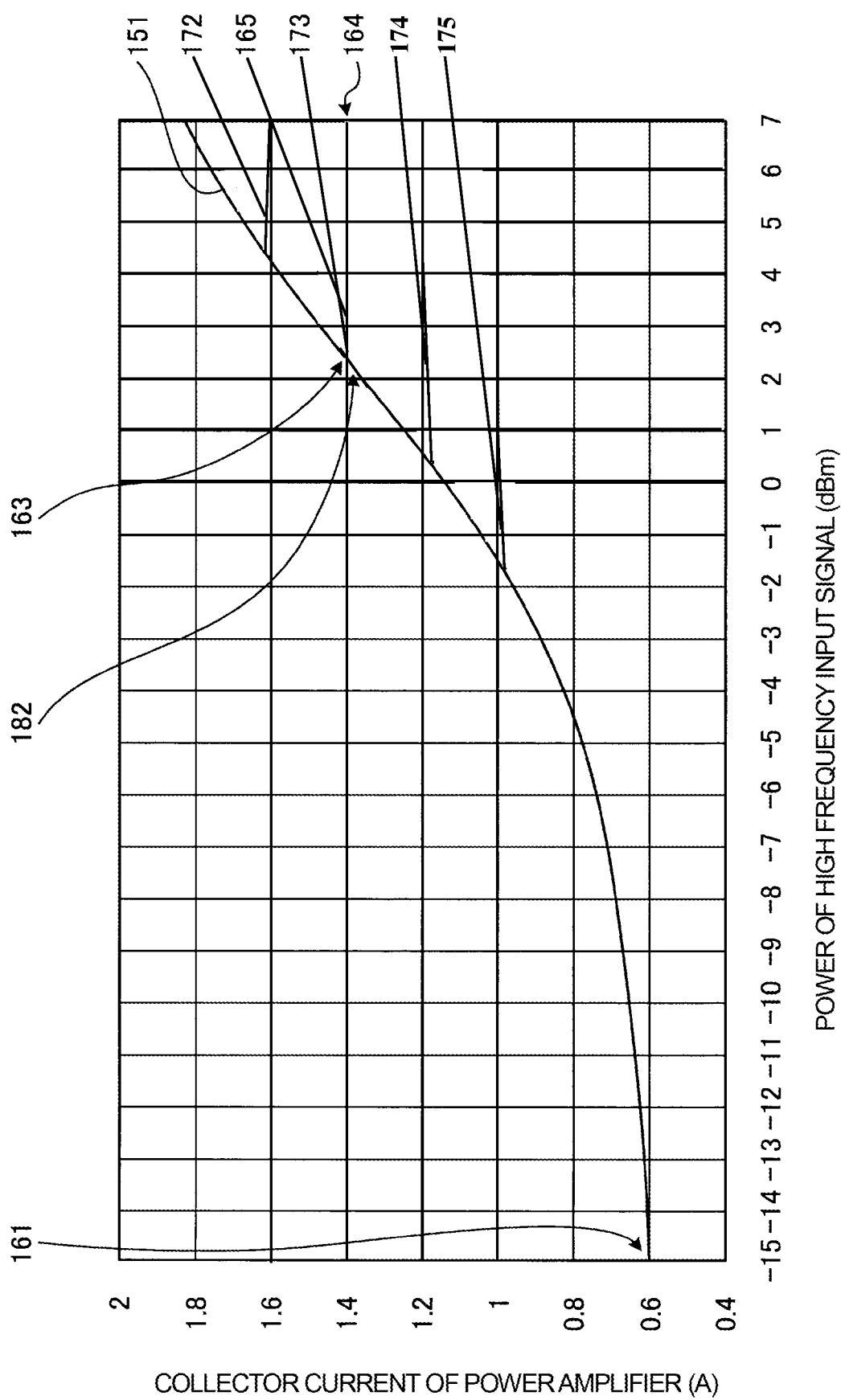
FIG. 4 is a diagram illustrating a circuit simulation result of the power amplifier circuit of the first embodiment.

FIG. 4 is a diagram illustrating a circuit simulation result of the power amplifier circuit of the first embodiment. Specifically, FIG. 4 is a diagram illustrating a relationship between the high frequency input signal RFin (dBm) and the collector current Icc (ampere) of the transistor 11.

A line 172 is the line illustrating a relationship between the high frequency input signal RFin and the collector current Icc of the transistor 11 in the case where the collector current Icc is suppressed so as not to exceed about 1.6 amperes. A line 173 is the line illustrating a relationship between the high frequency input signal RFin and the collector current Icc of the transistor 11 in the case where the collector current Icc is suppressed so as not to exceed about 1.4 amperes.

A line 174 is the line illustrating a relationship between the high frequency input signal RFin and the collector current Icc of the transistor 11 in the case where the collector current Icc is suppressed so as not to exceed about 1.2 amperes. A line 175 is the line illustrating a relationship between the high frequency input signal RFin and the collector current Icc of the transistor 11 in the case where the collector current Icc is suppressed so as not to exceed about 1.0 ampere.

Hereinafter, the description is provided by taking the case where the collector current Icc is suppressed so as not to exceed about 1.4 amperes (the case of the line 173) as an example.

In the first embodiment, the collector current Icc follows the line 151 from the point 161 to a point 182 (RFin≈2 dBm, Icc≈1.36 amperes) and approximately follows the line 165 after the point 182 up to the point 164. The reason is as follows.

The collector potential of the transistor 24 decreases when the bias current Ib1 increases and approaches the collector current IeC. When Ib1≈IeC, the collector potential of the transistor 24 is substantially equal (the deviation of the collector potential of the transistor 24 can be less than XX % from the base potential of the transistor 24) to the base potential of the transistor 24. As the bias current Ib1 further increases, the collector potential of the transistor 24 becomes lower than the base potential of the transistor 24. Then, the operational amplifier 41 outputs a signal of a positive potential to the gate of the transistor 42. This causes a drain-source path of the transistor 42 to be electrically continuous. That is to say, a path between the one end portion of the resistor 21 and the reference potential becomes electrically continuous with an ON resistance of the transistor 42 interposed therebetween. Accordingly, part of the bias current Ibias flows to the reference potential via the ON resistance of the transistor 42. This enables the current control circuit 40 to control the collector current Icc of the transistor 11 by suppressing an increase of the bias current Ibias, suppressing an increase of the base current Ib of the transistor 24, and controlling the bias current Ib1 of the transistor 11.

Further, in terms of potential, it can be considered that the base potential of the transistor 24 is suppressed by electrically connecting to the reference potential with the ON resistance of the transistor 42 interposed therebetween. That is to say, it can also be understood that the current control circuit 40 suppresses the base potential of the transistor 24 so as not to exceed the collector potential. This enables the current control circuit 40 to suppress part of the base current Ib of the transistor 24 flowing from the base to the emitter via the collector.

In consideration of the above, in the case where the collector current Icc of the transistor 11 is suppressed in such a way that the final upper limit of the collector current Icc of the transistor 11 is about 1.4 amperes, it becomes possible to set the setup value of the collector current IeC of the transistor 24 (set in the setup table 31a) at a value close to about 1.4 amperes (for example, set at nearly 1.36 amperes of the point 182).

In this way, the power amplifier circuit 1 enables to suppress dependency of the collector current Icc of the transistor 11 on the base current Ib of the transistor 24. This enables the power amplifier circuit 1 to suppress the "variation". Accordingly, the power amplifier circuit 1 can control the collector current Icc of the transistor 11 with a high degree of precision.

Second Embodiment

Figure 5:
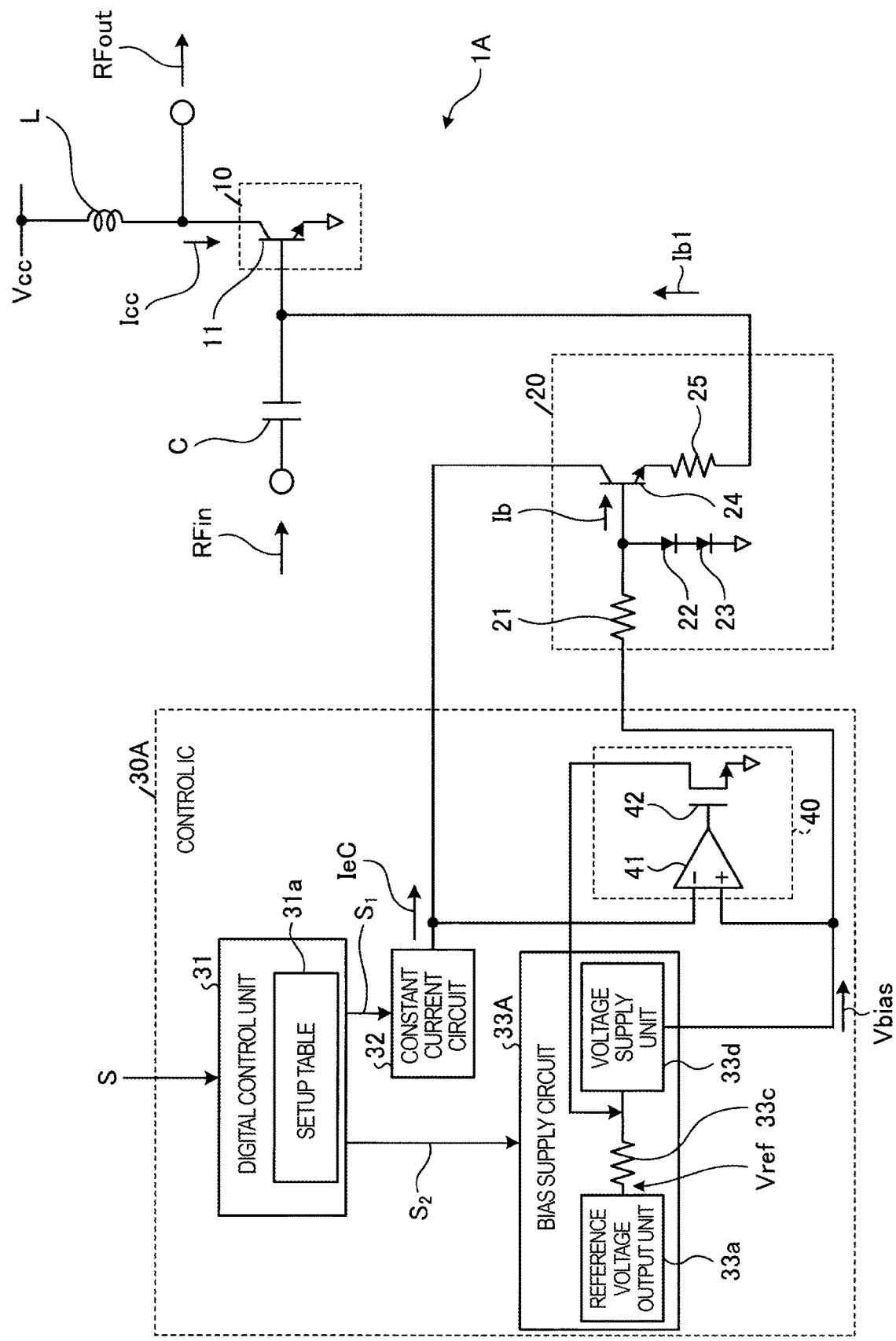
FIG. 5 is a diagram illustrating a configuration of a power amplifier circuit of a second embodiment.

FIG. 5 is a diagram illustrating a configuration of a power amplifier circuit of the second embodiment. A power amplifier circuit LA includes a control IC 30A in place of the control IC 30, compared with the power amplifier circuit 1 (see FIG. 3) of the first embodiment.

The circuit configurations of the power amplifier 10 and the bias circuit 20 are similar to those of the first embodiment, and the description thereof is omitted.

Compared with the control IC 30 of the first embodiment, the control IC 30A includes a bias supply circuit 33A in place of the bias supply circuit 33.

The bias supply circuit 33A includes a reference voltage output unit 33a, a resistor 33c, and a voltage supply unit 33d. Note that the resistor 33c may be replaced with an element having a resistive component.

The voltage supply unit 33d corresponds to the "voltage supply circuit" of the present disclosure.

The reference voltage output unit 33a outputs a reference voltage Vref associated with the control signal $S_2$ to one end portion of the resistor 33c. The other end portion of the resistor 33c is electrically connected to the voltage supply unit 33d. The voltage supply unit 33d outputs a bias voltage Vbias associated with the reference voltage Vref to the one end portion of the resistor 21.

The drain of the transistor 42 is electrically connected to the other end portion of the resistor 33c.

The operation of the current control circuit 40 is now described. A collector potential of the transistor 24 decreases when the bias current Ib1 increases and approaches the collector current IeC. As the bias current Ib1 further increases, the collector potential of the transistor 24 becomes lower than a bias voltage Vbias. Then, the operational amplifier 41 outputs a signal of a positive potential to the gate of the transistor 42. This causes the transistor 42 to be an ON state, and the drain-source path of the transistor 42 becomes electrically continuous. That is to say, a path between the other end portion of the resistor 33c and the reference potential becomes electrically continuous with the ON resistance of the transistor 42 interposed therebetween. Accordingly, the voltage to be input to the voltage supply unit 33d is a voltage obtained by dividing the reference voltage Vref with the resistor 33c and the ON resistance of the transistor 42. This decreases the bias voltage Vbias output from the voltage supply unit 33d. Accordingly, the current control circuit 40 can suppress the voltage to be applied to the base of the transistor 24 by suppressing the bias voltage Vbias and control the collector current Icc of the transistor 11 by suppressing the bias current Ib of the transistor 24.

The power amplifier circuit 1A produces effects similar to those of the power amplifier circuit 1.

Third Embodiment

Figure 6:
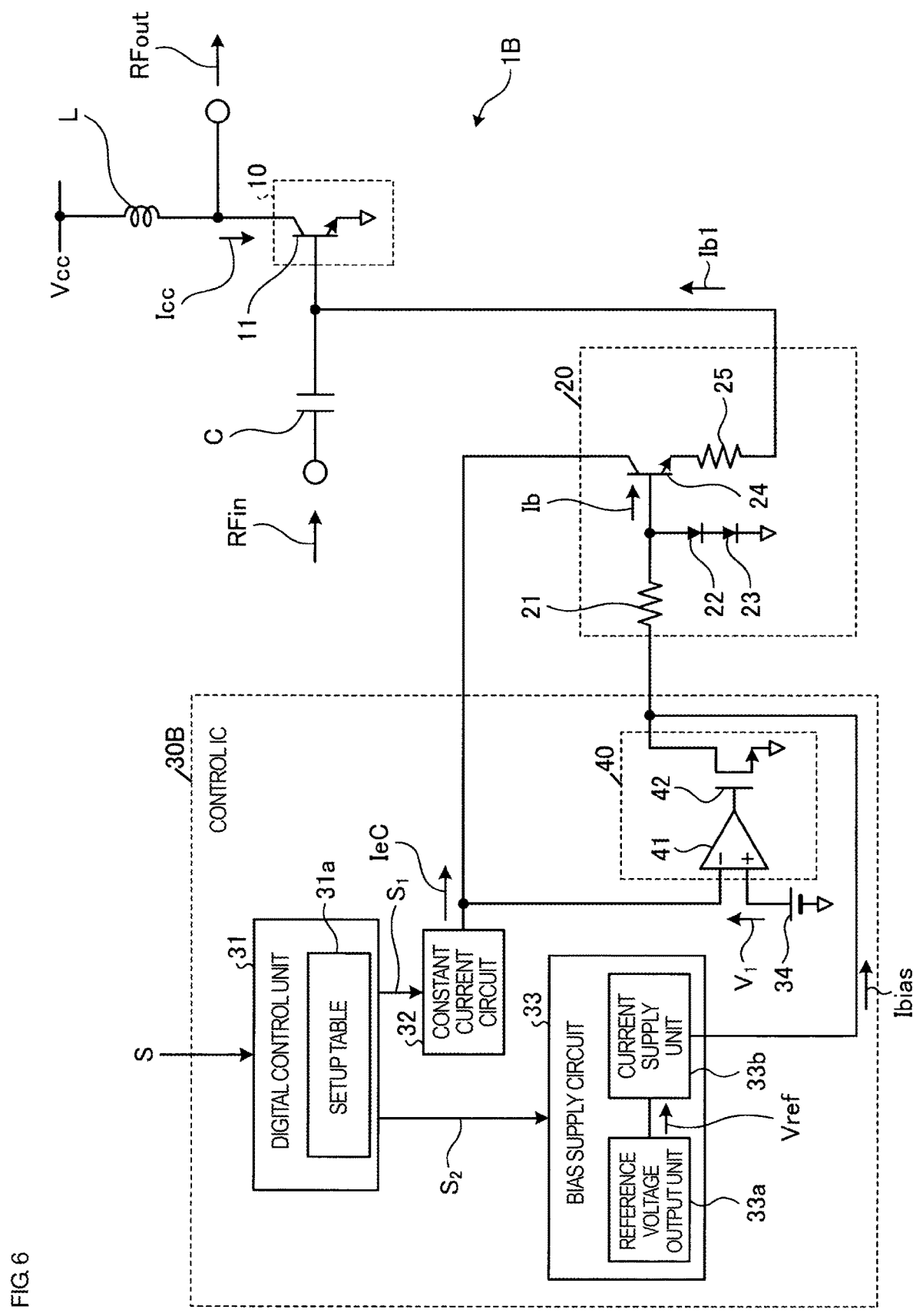
FIG. 6 is a diagram illustrating a configuration of a power amplifier circuit of a third embodiment.

FIG. 6 is a diagram illustrating a configuration of a power amplifier circuit of the third embodiment. A power amplifier circuit 1B includes a control IC 30B in place of the control IC 30, compared with the power amplifier circuit 1 (see FIG. 3) of the first embodiment.

The circuit configurations of the power amplifier 10 and the bias circuit 20 are similar to those of the first embodiment, and the description thereof is omitted.

Compared with the control IC 30 of the first embodiment, the control IC 30B further includes a constant voltage source 34.

The constant voltage source 34 outputs a constant voltage $V_1$ to the non-inverting input terminal of the operational amplifier 41. Accordingly, the operational amplifier 41 outputs a signal associated with a voltage between the constant voltage $V_1$ and the collector of the transistor 24 to the gate of the transistor 42.

The operation of the current control circuit 40 is now described. A collector potential of the transistor 24 decreases when the bias current Ib1 increases and approaches the collector current IeC. As the bias current Ib1 further increases, the collector potential of the transistor 24 becomes lower than the constant voltage $V_1$. Then, the operational amplifier 41 outputs a signal of a positive potential to the gate of the transistor 42. This causes a drain-source path of the transistor 42 to be electrically continuous. That is to say, a path between the one end portion of the resistor 21 and the reference potential becomes electrically continuous with an ON resistance of the transistor 42 interposed therebetween. Accordingly, part of the bias current Ibias flows to the reference potential via the ON resistance of the transistor 42. This enables the current control circuit 40 to suppress an increase of the base current Ib of the transistor 24.

Further, in terms of potential, it can be considered that the base potential of the transistor 24 is suppressed by electrically connecting to the reference potential with the ON resistance of the transistor 42 interposed therebetween. That is to say, it can also be understood that the current control circuit 40 suppresses the base potential of the transistor 24 so as not to exceed the collector potential. This enables the current control circuit 40 to suppress the flow of part of the base current Ib of the transistor 24 from the base to the emitter via the collector.

The power amplifier circuit 1B produces effects similar to those of the power amplifier circuit 1.

Depending on characteristics or the like of the bias circuit 20, which is an emitter follower circuit, a designer can set an arbitrary constant voltage $V_1$. There is not much difference in effect or precision, and the impact on the effect is small even when the constant voltage $V_1$ varies.

When the power amplifier circuit 10 is in operation, a high frequency signal or the like propagates to an output terminal (terminal outputting the collector current IeC) of the constant current circuit 32 or an output terminal (terminal outputting the bias current Ibias) of the current supply unit 33b. Further, when electrically connecting the output terminal of the constant current circuit 32 and the output terminal of the current supply unit 33b to the operational amplifier 41, the constant current circuit 32 and the current supply unit 33b are laid out close to the operational amplifier 41. Accordingly, in the power amplifier circuit 1 of the first embodiment, there is the possibility that a long wiring that picks up electrical noise could be laid in between the non-inverting input terminal of the operational amplifier 41 and the one end portion of the resistor 21. However, in the power amplifier circuit 1B of the second embodiment, the non-inverting input terminal of the operational amplifier 41 is electrically connected to the constant voltage source 34. Accordingly, the power amplifier circuit 1B of the second embodiment has an effect of reducing the influence of the noise.

Fourth Embodiment

Figure 7:
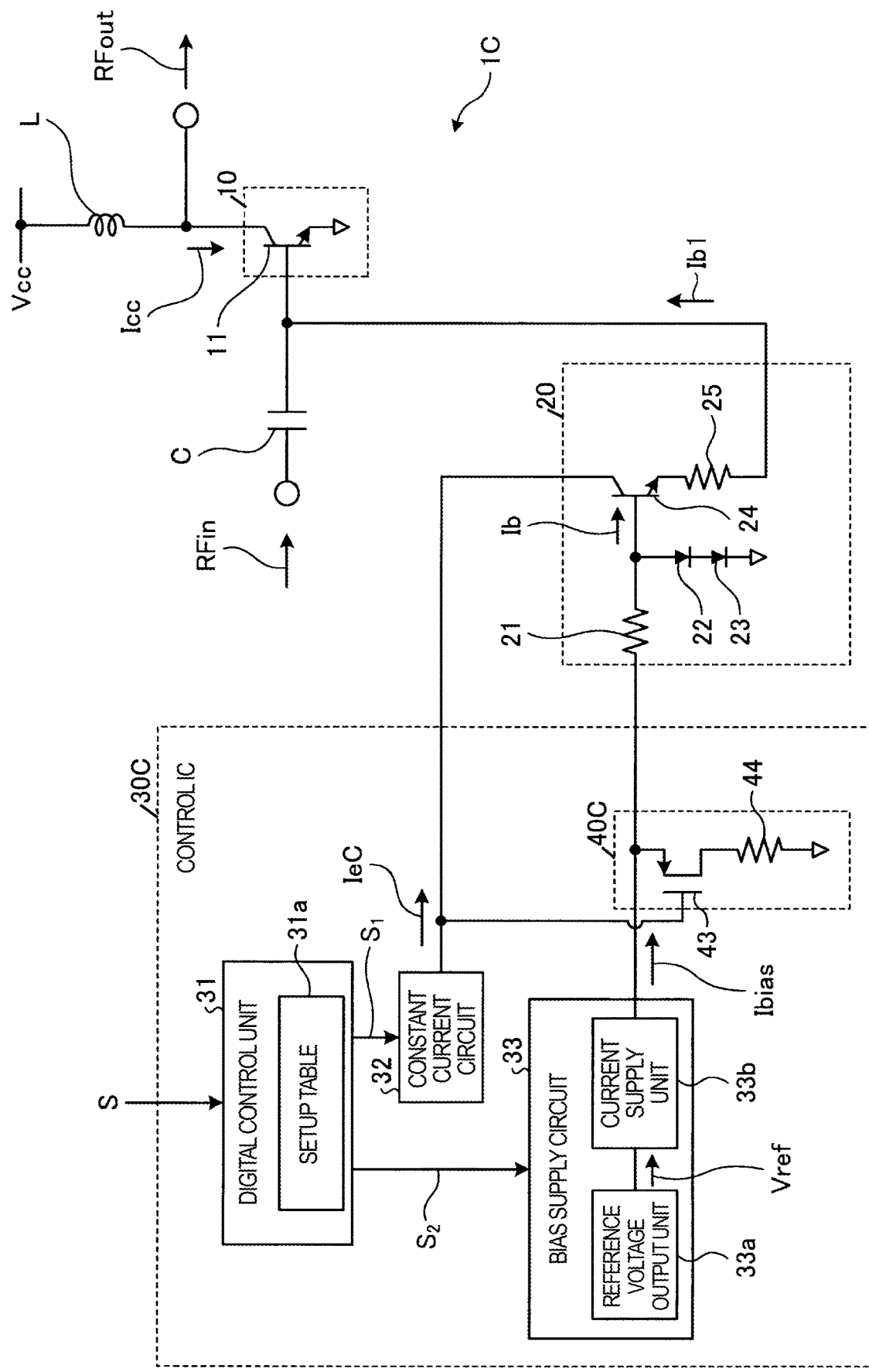
FIG. 7 is a diagram illustrating a configuration of a power amplifier circuit of a fourth embodiment.

FIG. 7 is a diagram illustrating a configuration of a power amplifier circuit of the fourth embodiment. A power amplifier circuit 1C includes a control IC 30C in place of the control IC 30, compared with the power amplifier circuit 1 (see FIG. 3) of the first embodiment.

The circuit configurations of the power amplifier 10 and the bias circuit 20 are similar to those of the first embodiment, and the description thereof is omitted.

Compared with the control IC 30 of the first embodiment, the control IC 30C includes a current control circuit 40C in place of the current control circuit 40.

The current control circuit 40C includes a P-channel type transistor 43 and a resistor 44.

A source of the transistor 43 is electrically connected to the one end portion of the resistor 21. A gate of the transistor 43 is electrically connected to the collector of the transistor 24. A drain of the transistor 43 is electrically connected to one end portion of the resistor 44. The other end portion of the resistor 44 is electrically connected to the reference potential. The resistor 44 serves to offset a gate potential of the transistor 43 toward a more positive potential side than the reference potential.

The operation of the current control circuit 40C is now described. A collector potential of the transistor 24 decreases when the bias current Ib1 increases and approaches the collector current IeC. When Ib1≈IeC, the collector potential of the transistor 24 is substantially equal (the deviation of the collector potential of the transistor 24 can be less than XX % from the base potential of the transistor 24) to the base potential of the transistor 24. As the bias current Ib1 further increases, the collector potential of the transistor 24 becomes lower than the base potential of the transistor 24. Then, the gate potential of the transistor 43 becomes lower than the source potential, and this causes a source-drain path of the transistor 43 to be electrically continuous. That is to say, a path between the one end portion of the resistor 21 and one end portion of the resistor 44 becomes electrically continuous with the ON resistance of the transistor 43 interposed therebetween. Accordingly, part of the bias current Ibias flows to the reference potential via the ON resistance of the transistor 43 and the resistor 44. This enables the current control circuit 40C to suppress an increase of the bias current Ibias, suppress an increase of the base current Ib of the transistor 24, and control the bias current Ib1 of the transistor 11, thereby enabling to control the collector current Icc of the transistor 11. Note that the resistor 44 may be replaced with an element having a resistive component.

Further, in terms of potential, it can be considered that the base potential of the transistor 24 is suppressed by the ON resistance of the transistor 43 and the resistor 44. That is to say, it can also be understood that the current control circuit 40C suppresses the base potential of the transistor 24 so as not to exceed the collector potential. This enables the current control circuit 40C to suppress the flow of part of the base current Ib of the transistor 24 from the base to the emitter via the collector.

The power amplifier circuit 1C produces effects similar to those of the power amplifier circuit 1.

The embodiments described above are provided to facilitate understanding of the present disclosure and is not to be construed as limiting the present disclosure. The present disclosure can be modified or improved without necessarily departing from its spirit, and the present disclosure also includes equivalents thereof.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A current control circuit comprising:
   a first circuit; and
   a second circuit,
   wherein the current control circuit is configured to control a base current of a first transistor based on a base-collector voltage of the first transistor,
   wherein the first transistor is included in a bias circuit configured to output a bias current from an emitter of the first transistor to a power amplifier,
   wherein the first circuit is configured to output a signal associated with the base-collector voltage of the first transistor, and
   the second circuit is configured to, based on the signal, provide electrical continuity between a base of the first transistor and a reference potential.

2. A power amplifier circuit comprising:
   the current control circuit according to claim 1;
   the power amplifier, wherein the power amplifier is configured to amplify a high frequency signal; and
   the bias circuit comprising the first transistor and being configured to output the bias current to the power amplifier.

3. The current control circuit according to claim 1, wherein:
   the first circuit comprises an operational amplifier configured to receive a base potential of the first transistor at a non-inverting input terminal, and to receive a collector potential of the first transistor at an inverting input terminal, and
   the second circuit comprises a second transistor, a drain of the second transistor being electrically connected to the base of the first transistor, a gate of the second transistor being configured to receive an output signal from the operational amplifier, and a source of the second transistor being electrically connected to the reference potential.

4. The current control circuit according to claim 1, wherein:
   the first circuit comprises an operational amplifier configured to receive a base potential of the first transistor at a non-inverting input terminal, and to receive a collector potential of the first transistor at an inverting input terminal, and
   the second circuit comprises a second transistor, a drain of the second transistor being electrically connected to an input terminal of a power supply circuit, the power supply circuit being configured to output a voltage associated with an input reference voltage to the base of the first transistor, a gate of the second transistor being configured to receive an output signal from the operational amplifier, and a source of the second transistor being electrically connected to the reference potential.

5. The current control circuit according to claim 1, wherein:
   the first circuit comprises an operational amplifier configured to receive a constant voltage at a non-inverting input terminal, and to receive a collector potential of the first transistor at an inverting input terminal, the constant voltage being output from a constant voltage source, and the second circuit comprises a second transistor, a drain of the second transistor being electrically connected to the base of the first transistor, a gate of the second transistor being configured to receive an output signal from the operational amplifier, and a source of the second transistor being electrically connected to the reference potential.

6. A The current control circuit comprising:

a first circuit; and a second circuit, wherein the current control circuit is configured to control a base current of a first transistor based on a base-collector voltage of the first transistor, wherein the first transistor is included in a bias circuit configured to output a bias current from an emitter of the first transistor to a power amplifier, wherein the first circuit comprises a third transistor, wherein the second circuit comprises a resistive component, wherein a source of the third transistor is electrically connected to a base of the first transistor, a gate of the third transistor is electrically connected to a collector of the first transistor, and a drain of the third transistor is electrically connected to a first end of the resistive component, and wherein a second end the resistive component is electrically connected to a reference potential.

7. A power amplifier circuit comprising:

the current control circuit according to claim 6;

the power amplifier, wherein the power amplifier is configured to amplify a high frequency signal; and the bias circuit comprising the first transistor and being configured to output the bias current to the power amplifier.

8. A power amplifier circuit comprising:

the current control circuit according to claim 5;

the power amplifier, wherein the power amplifier is configured to amplify a high frequency signal; and the bias circuit comprising the first transistor and being configured to output the bias current to the power amplifier.

9. A power amplifier circuit comprising:

the current control circuit according to claim 3;

the power amplifier, wherein the power amplifier is configured to amplify a high frequency signal; and the bias circuit comprising the first transistor and being configured to output the bias current to the power amplifier.

10. A power amplifier circuit comprising:

current control circuit according to claim 4;

the power amplifier, wherein the power amplifier is configured to amplify a high frequency signal; and the bias circuit comprising the first transistor and being configured to output the bias current to the power amplifier.

* * * * *